(12) United States Patent
Lykins, II

(10) Patent No.: US 6,245,445 B1
(45) Date of Patent: *Jun. 12, 2001

(54) ROUGH ELECTRICAL CONTACT SURFACE

(75) Inventor: James L. Lykins, II, San Jose, CA (US)

(73) Assignee: Kulicke & Soffa Industries, Inc., Willow Grove, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,273

(22) Filed: Mar. 2, 1999

Related U.S. Application Data

(62) Division of application No. 08/586,232, filed on Jan. 12, 1996, now Pat. No. 5,876,580.

(51) Int. Cl.⁷ .................. C25D 1/18; G01R 31/02
(52) U.S. Cl. .................. 428/626; 428/687; 324/754; 324/757; 200/279; 205/111
(58) Field of Search .................. 428/626, 209, 428/687; 324/754, 757; 438/17, 18; 200/279; 208/111

(56) References Cited

U.S. PATENT DOCUMENTS

| | | | |
|---|---|---|---|
| 4,038,158 | 7/1977 | Bursey et al. | 204/23 |
| 4,436,591 | 3/1984 | De Hek | 204/11 |
| 4,461,680 | 7/1984 | Lashmore | 204/41 |
| 4,804,132 | 2/1989 | DiFrancesco | 228/115 |
| 5,083,697 | 1/1992 | DeFrancesco | 228/116 |
| 5,185,073 | * 2/1993 | Bindra et al. . | |
| 5,213,876 | 5/1993 | Smyth, Jr. et al. | 428/209 |
| 5,402,077 | 3/1995 | Agahdel et al. | 324/758 |
| 5,428,298 | * 6/1995 | Ko . | |
| 5,433,797 | 7/1995 | Erb et al. | 148/304 |
| 5,471,151 | * 11/1995 | DiFrancesco . | |
| 5,475,318 | * 12/1995 | Marcus et al. . | |
| 5,483,741 | * 1/1996 | Marcus et al. . | |
| 5,486,280 | 1/1996 | Bullock, IV et al. | 205/67 |
| 5,487,999 | * 1/1996 | Farnworth . | |
| 5,506,514 | * 4/1996 | DiFrancesco . | |
| 5,584,983 | 12/1996 | Pruyn | 205/103 |
| 5,642,055 | * 6/1997 | DiFrancesco . | |

OTHER PUBLICATIONS

Benhenda, S. et al., "Effect of Pulse Plating Parameters On Electrical Contact Behavior of Nickel Coatings", *IEEE Transactions on Components, Packaging, and Manufacturing Technology—Part A* (Jun. 1994) 17(2):303–308.

Bryant, Michael D., "Resistance Buildup in Electrical Connectors Due to Fretting Corrosion of Rough Surfaces", *IEEE Transactions on Components, Packaging, and Manufacturing Technology—Part A* (Mar. 1994) 17(1):86–95.

Law, Henry H. et al., "Electrical Contact Phenomena of Nickel Electrodeposits with Sharp Micro–Asperities", *IEEE Transactions on Components, Hybrids, and Manufacturing Technology—Part A* (Sep. 1991) 14(3):585–591.

Thoma, Martin, "A Cobalt/Chromic Oxide Composite Coating for High–Temperature Wear Resistance", *Plating and Surface Finishing* (Sep. 1994) pp. 51–53.

Tomaszewski, T.W. et al., "Codeposition of Finely Dispersed Particles with Metals", *Plating* (Nov. 1969) pp. 1234–1239.

Zahavi, Joseph et al., "Properties of Electrodeposited Composite Coatings", *Plating and Surface Finishing* (Jan. 1982) pp. 76–82.

* cited by examiner

Primary Examiner—Deborah Jones
Assistant Examiner—Jason Savage
(74) Attorney, Agent, or Firm—Fish & Richardson P.C.

(57) ABSTRACT

A method for rendering a surface of a contact rough includes submerging the surface of the contact in an electroplating bath having a dissolved metal salt, and pulsing an electric current through the contact and the bath to form a rough metallic structure on the surface of the contact.

17 Claims, 11 Drawing Sheets

ROUGH ELECTRICAL CONTACT SURFACE

This application is a divisional (and claims the benefit of priority under 35 USC 120) of U.S. application Ser. No. 08/586,232, filed Jan. 12, 1996, now issued as U.S. Pat. No. 5,876,580, Mar. 2, 1999. The disclosure of the prior application is considered part of (and is incorporated by reference in) the disclosure of this application.

BACKGROUND

This invention relates to rough electrical contact surfaces. For example, rough surfaces may be useful on contact pad surfaces in thin-film membranes used for testing integrated semiconductor devices. The contact pad surfaces make contact with device pads on the surface of semiconductor devices. See co-pending U.S. patent application Ser. No. 08/303,498. Because device pads can develop oxide layers, the membrane contact pads must penetrate oxide layers or other contaminants to make good electrical connections.

One method of penetration wears away the oxide layer by force often combined with rubbing motion. Another method of penetration uses contact pads having roughened surfaces that can pierce through the oxide layer. The roughened surface can be made, for example, by depositing already-formed, small, hard (e.g., of rhodium or titanium carbide) particles on the surface of a contact pad, and then electroplating the whole assembly with a thin layer of nickel.

SUMMARY

In general, in one aspect, the invention features a method for rendering a surface of a contact rough, including submerging the surface of the contact in an electroplating bath having a dissolved metal salt, and pulsing an electric current through the contact and the bath to form a rough metallic structure on the surface of the contact.

Implementations of the invention may feature the following features. The dissolved metal salt may include nickel chloride. The electroplating bath may have a concentration of about 150 to about 400 grams of nickel chloride dissolved in a liter of water. The electroplating bath may be heated to about 55 degrees C.±about 5 degrees. The electric current may have a current density of between about 35 amps per square foot to about 75 amps per square foot. The rough metallic structure may be plated with gold. The electric current may be pulsed for a length of time between 0 and about 3 minutes, and may be pulsed with a duty cycle having an on period greater than an off period. The ratio of the on period to the off period may be between about 4:1 and about 8:1. The on period may be between about 0.4 seconds and about 0.8 seconds, and the off period may be about 0.1 seconds. The ratio of the on period to the off period may be about 6:1, and the on period may be about 0.6 seconds and the off period may be about 0.1 seconds.

The rough metal structure may be comprised of spikes. The spikes may be substantially conical. The spikes may have a height between about 0.350 microns and about 1.275 microns. The spikes may have a base between about 0.345 microns and about 1.250 microns. A side of each of the spikes may have an angle from normal of between about 10 degrees and about 45 degrees. The spikes may have a density of between about 1 and about 2 spikes per square micrometer.

In general, in another aspect, the invention provides a roughened contact including a contact having a surface, and a solid metal layer deposited on the surface of the contact and having spikes protruding away from the contact.

In general, in another aspect, the invention provides a roughened contact including a contact having a surface, a solid metal layer deposited on the surface of the contact, wherein the solid metal layer comprises nickel, having spikes protruding away from the contact, wherein the spikes are substantially conical, the spikes have a height between about 0.350 microns and about 1.275 microns, the spikes have a base between about 0.345 microns and about 1.250 microns, wherein a side of each of the spikes has an angle from normal of between about 10 degrees and about 45 degrees, and wherein the spikes have a density of between about 1 and about 2 spikes per square micrometer, and a conductive plating deposited on the surface of the solid metal surface, wherein the conductive plating comprises gold.

In general, in another aspect, the invention provides a membrane for use in testing a circuit including a flexible membrane substrate, a contact on the flexible membrane substrate having a surface, and a solid metal layer deposited on the surface of the contact and having spikes protruding away from the contact.

Implementations of the invention may feature the following features. The spikes may be substantially conical. The solid metal layer may include nickel. A conductive plating may be deposited on the surface of the solid metal layer. The conductive plating may include gold. The flexible membrane substrate may include a polyimide film.

The advantages of the invention may include one or more of the following. Relatively sharp spikes may be created on the surface of a contact. These spikes may be deposited with a relatively uniform height, and dispersed relatively evenly across the contact surface. These spikes do not require the dropping of hardened particles onto the contact surface. Instead, these spikes may be created through a simple, continuous electroplating process. The hard, sharp spikes reduce damage to small and delicate components and form consistently reliable connections.

Other features and advantages of the invention will become apparent from the following description and from the claims.

DESCRIPTION

Referring to FIGS. 1a through 1g, a particle-less spike deposition procedure begins with a substrate 10. Substrate 10 may be a polyimide thin-film membrane, a pad deposited on a membrane, a semiconductor wafer, a printed circuit board, or any other material requiring electrical contacts. Usually a thin metal seed layer 11 is deposited on the upper surface of substrate 10. Seed layer 11 may be a 100–400 Å layer of chromium, with a 500–4000 Å layer of copper. Seed layer 11 may be used to conduct electric current during electroplating steps.

Figure 1A:
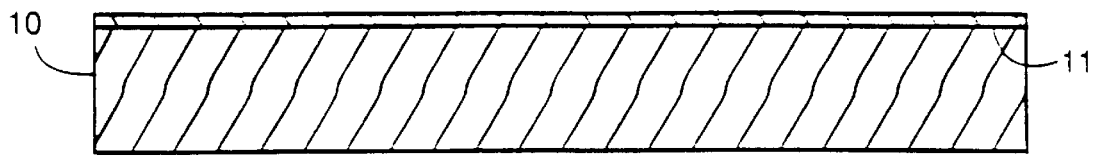
FIGS. 1a through 1g are cross-sections of a substrate during a spike deposition procedure.
Figure 1B:
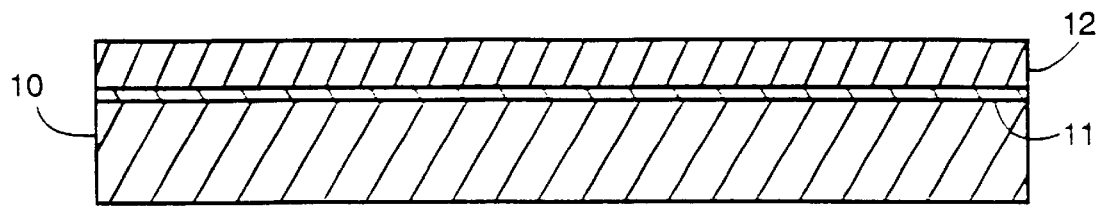
Figure 1C:
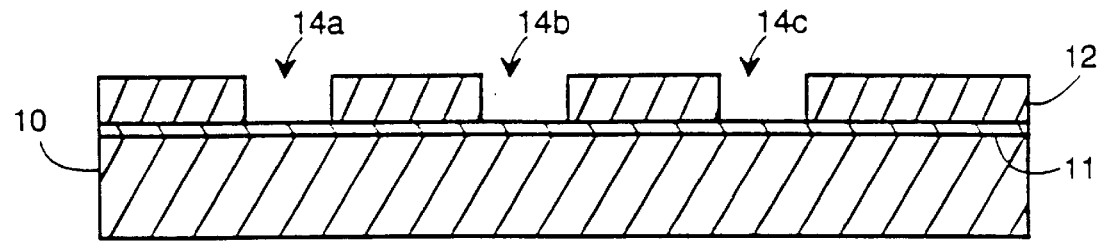

Next, a photoresist layer 12 is deposited on the upper surface of seed layer 11, as in FIG. 1b. Photoresist layer 12 is exposed in certain regions and then dissolved away leaving bump areas 14a, 14b, and 14c. The surface of seed layer 11 in each bump area 14 is then cleaned with agents suitable for the substrate material. If substrate 10 is a contact formed on a polyimide film, its exposed areas may be cleaned by first plasma cleaning the surface, second using an acid cleaner combined with a wetting agent, and third immersing substrate 10 in an acid dip. The cleaned and exposed bump areas 14 are then ready for bump and spike deposition.

Figure 2:
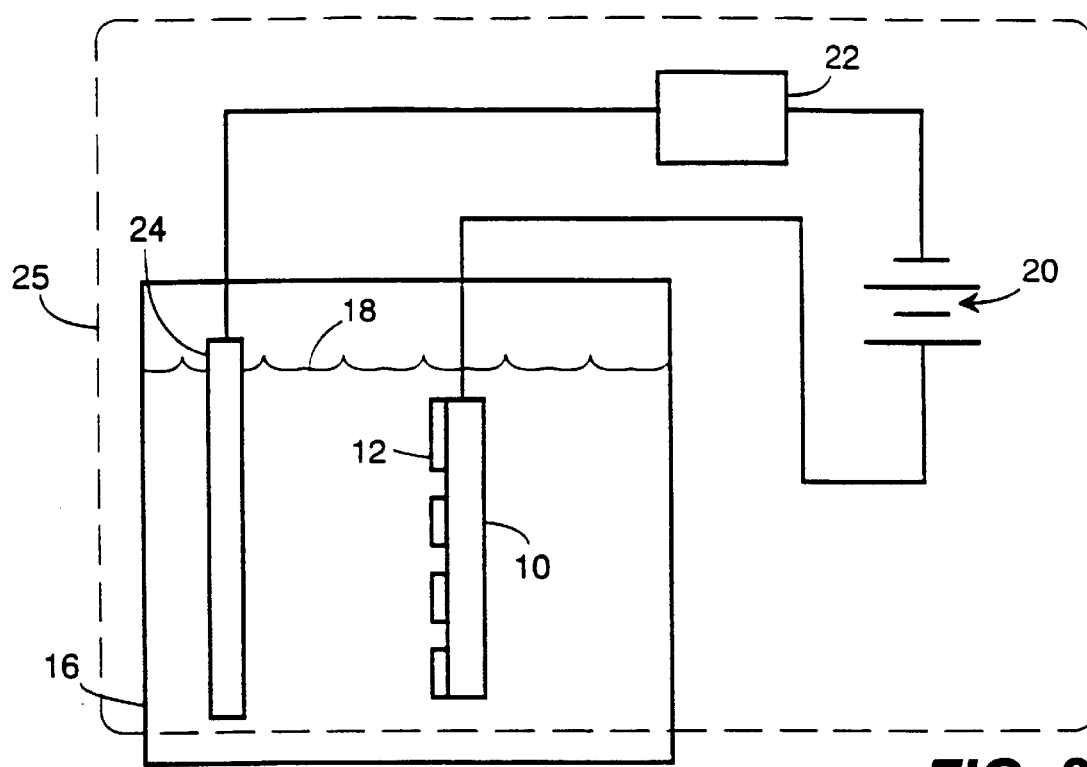
FIG. 2 is a schematic diagram of spike deposition apparatus.

Using the apparatus of FIG. 2, substrate 10 (with masking photoresist layer 12) is placed in a tank 16 containing an electroplating solution 18. One effective solution uses a concentration of 150 to 400 grams nickel chloride to each liter of deionized water, mixed with 30 to 45 grams of boric acid. Substrate 10 is connected to a current source 20, whose other terminal connects, through current regulator 22, to electrode 24 emersed in electroplating solution 18, forming electrical circuit 25.

Figure 1D:
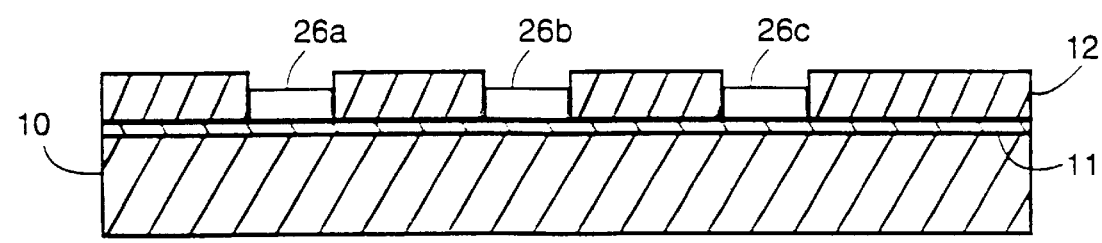

Referring to FIG. 1d, a first solid layer (or base) 26a, 26b, 26c for each bump is deposited within each bump area 14a, 14b, and 14c. These first layers 26, e.g., of nickel, may be deposited through a steady application of current through circuit 25. Particle-less spikes 28 are then deposited on the top surface of each of these first layers 26 by pulsing current through circuit 25. During spike deposition, the electroplating solution 18 may be heated to approximately 55 degrees Centigrade±5 degrees. Current density may be between about 35 amps per square foot and about 75 amps per square foot. The electroplating solution 18 may have a Ph between 1.1 and 3.0, and may be agitated using percolated $N_2$ air.

Figure 3:
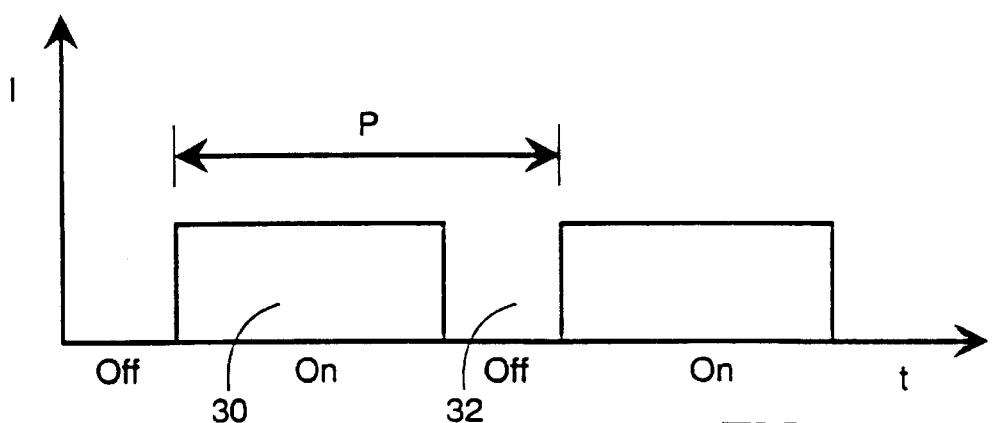
FIG. 3 is a timing diagram of applied current during spike deposition.

The current may be pulsed with a repeated duty cycle as shown in FIG. 3, where period P is broken into two sub-periods: a first, ON period 30 where current I through circuit 25 is high, and a second, OFF period 32, where current I is zero. Good results have been achieved using a duty cycle period of between 0.5 seconds and 0.9 seconds, where ON period 30 lasts between about 0.4 seconds and 0.8 second, and OFF period 32 last about 0.1 seconds. The current may be pulsed typically between 0 and 3 minutes. The periodic pulsing of current through circuit 25 causes nickel spike formations 28 to grow on the exposed surfaces of each bump 26. These pointed spikes 28 are grown without use of any deposited hard particles.

Through experimentation, good growth parameters include a 55 degree C. temperature for electroplating solution 18, a current of 35 amps per square foot, and a current duty cycle having an ON period of about 0.6 seconds, and an OFF period of about 0.1 seconds. The current is pulsed for a total of about 3 minutes.

Figure 1E:
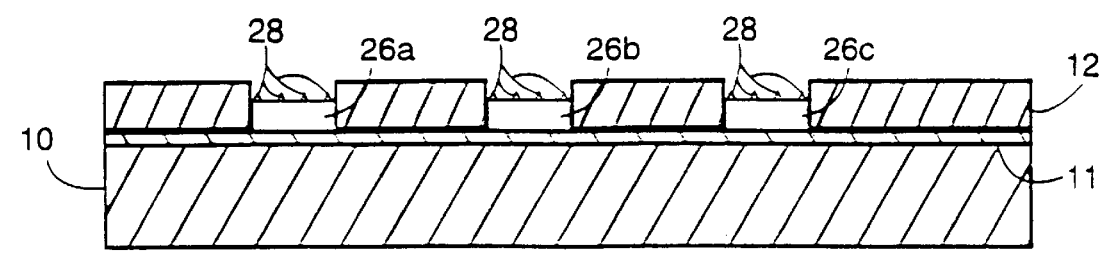
Figure 1F:
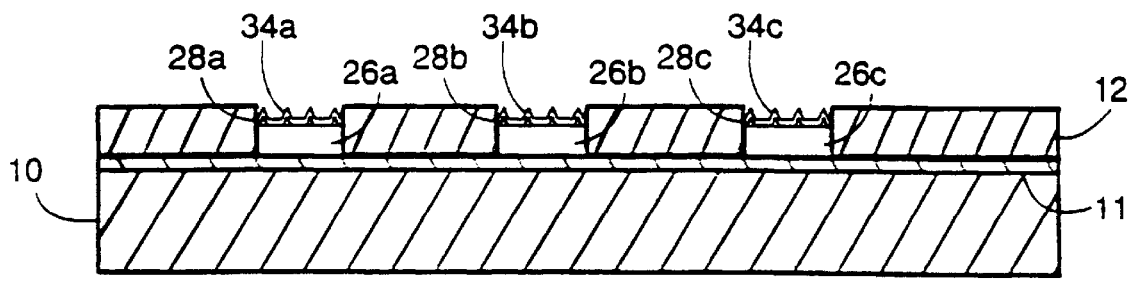
Figure 1G:
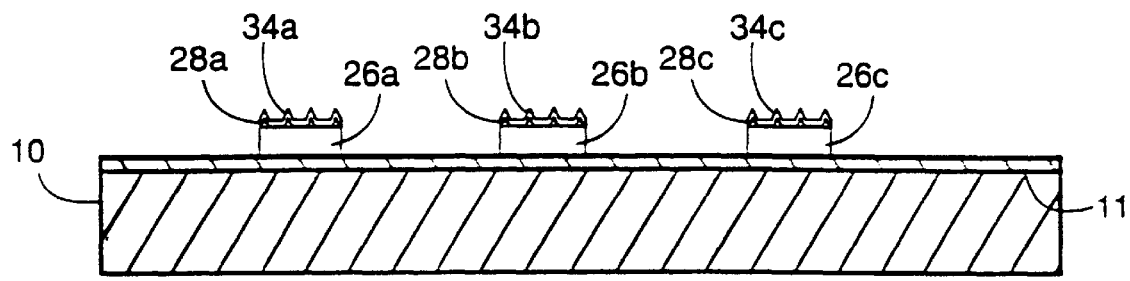
Figure 4:
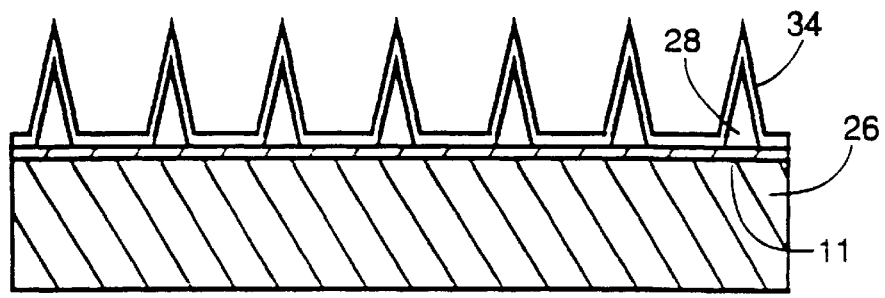
FIG. 4 is a cross-section of a substrate including particle-less spikes.

Referring to FIG. 1e, spikes 28 deposited across the exposed surfaces of bumps 26 have a layer of gold 34 deposited over spikes 28, to ensure good electrical contact (FIG. 1f). Depending upon application, gold layer 34 may not be required. Then photoresist layer 12 is stripped, leaving a series of exposed bumps 26 on the surface of substrate 10, each bump 26 having sharp spikes 28, coated with gold layer 34, as shown in FIG. 1g, and in greater detail in FIG. 4. The surface of substrate 10, having such spikes 28, may be referred to as roughened.

Figure 5:
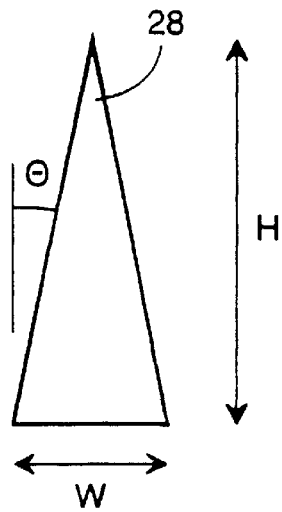
FIG. 5 is a cross-section of a single spike.
Figure 6A:
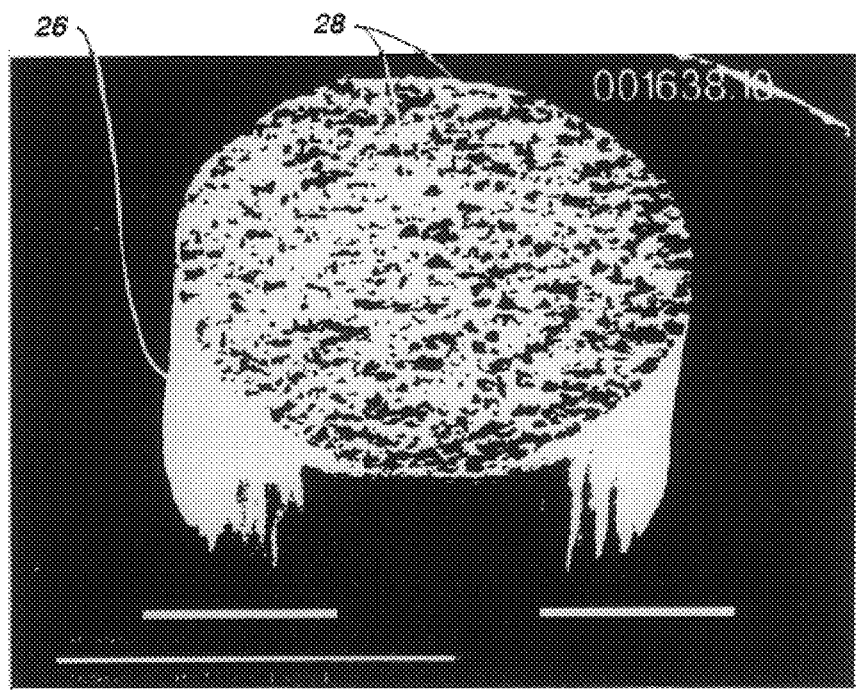
FIGS. 6a and 6b are photomicrographs of a contact pad including particle-less spikes.
Figure 6B:
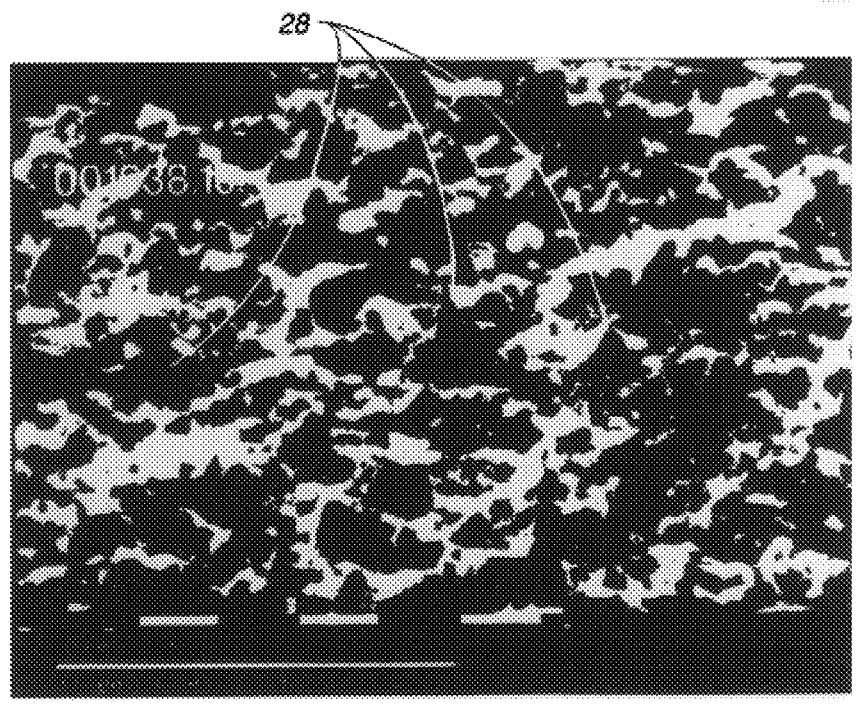
Figure 7A:
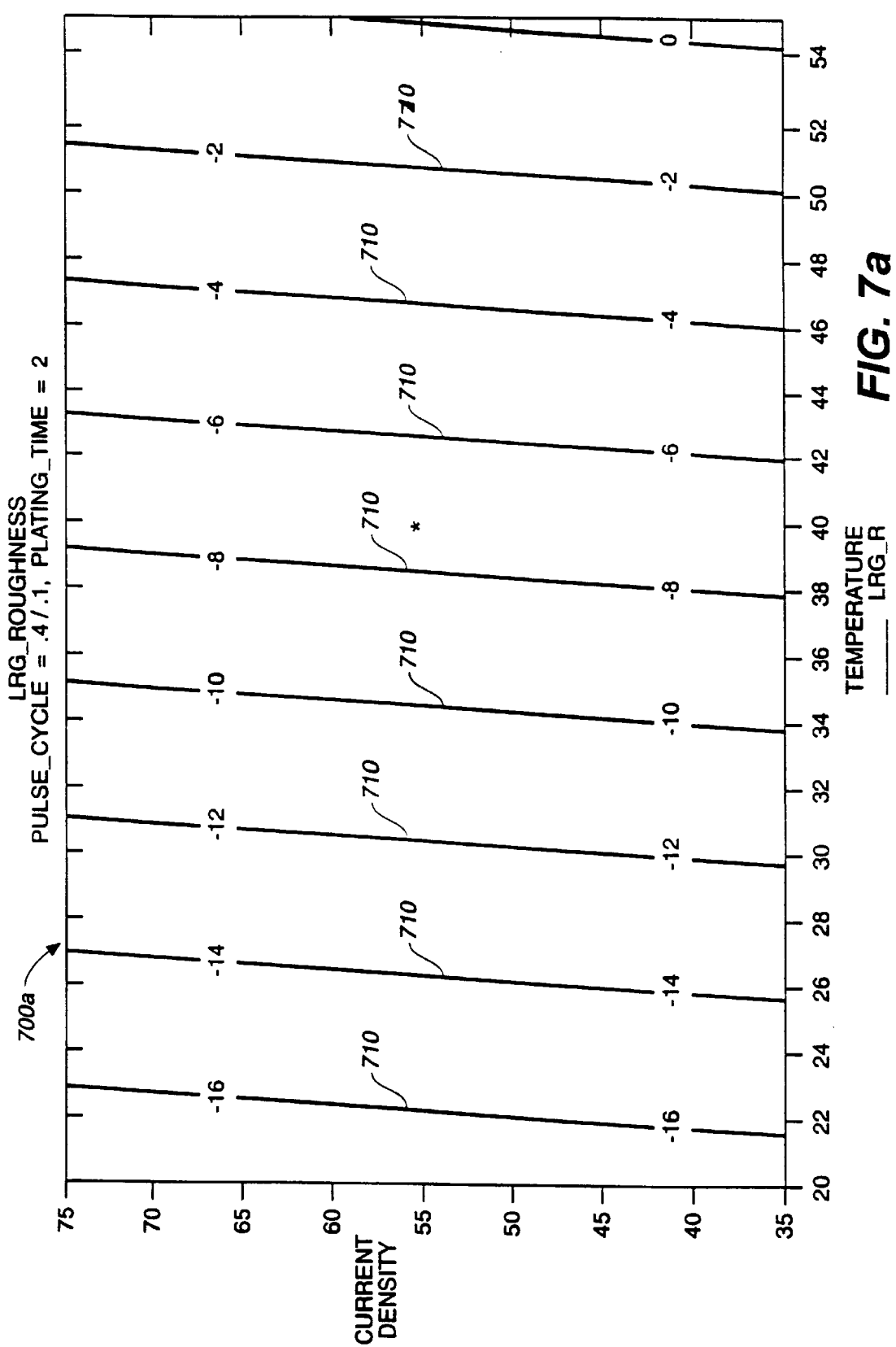
FIGS. 7a through 7f are contour plots of spike deposition parameters.
Figure 7B:
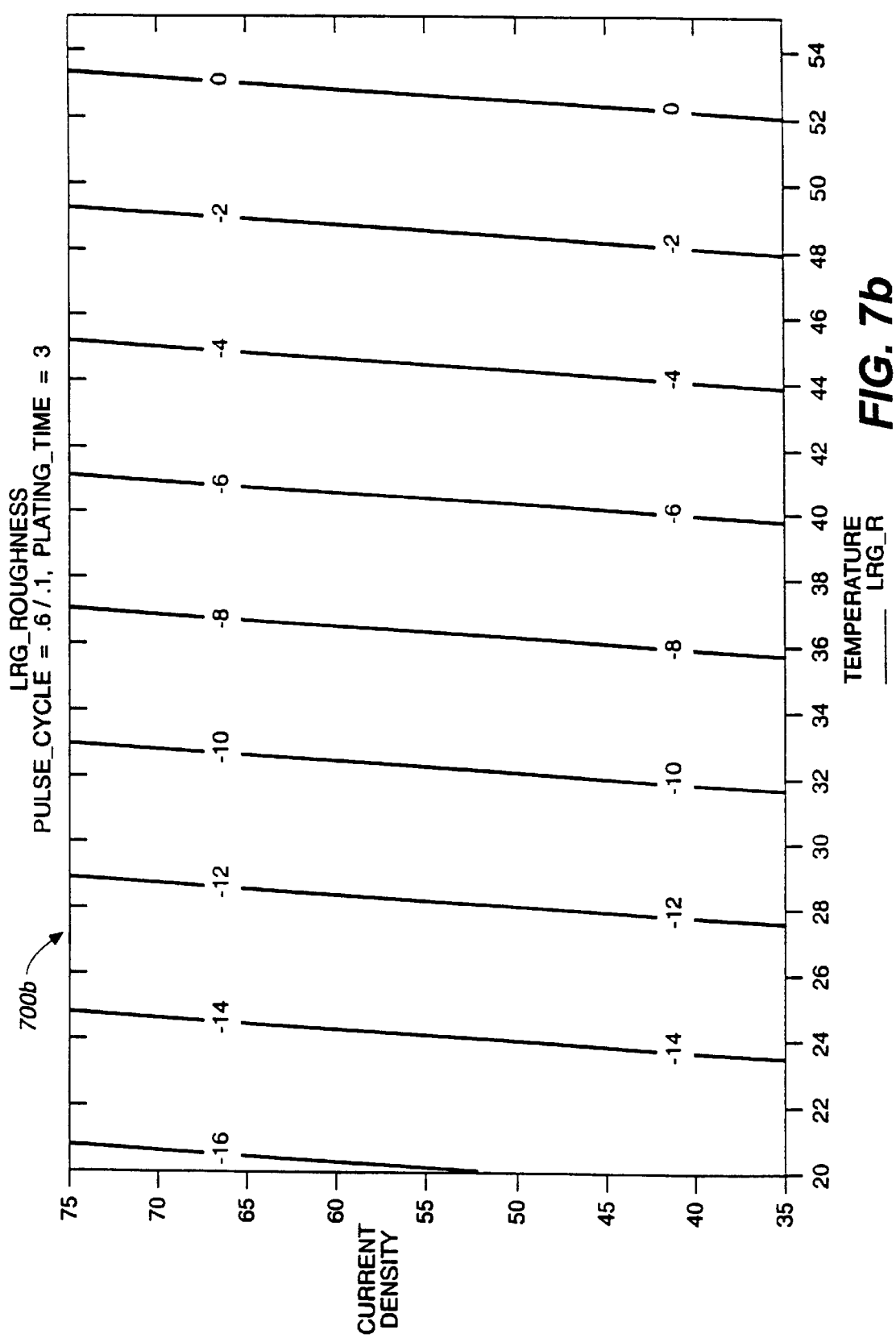
Figure 7C:
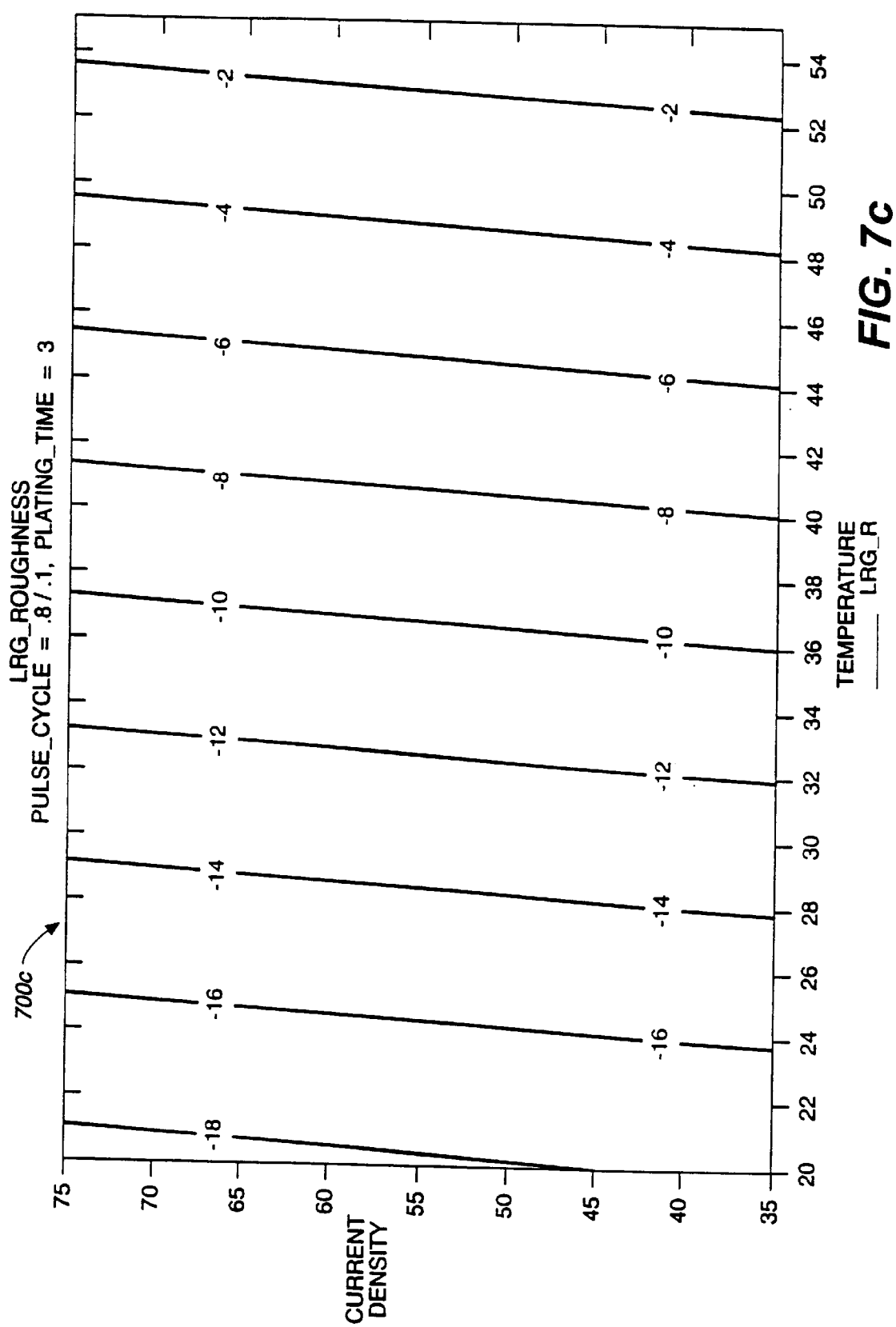
Figure 7D:
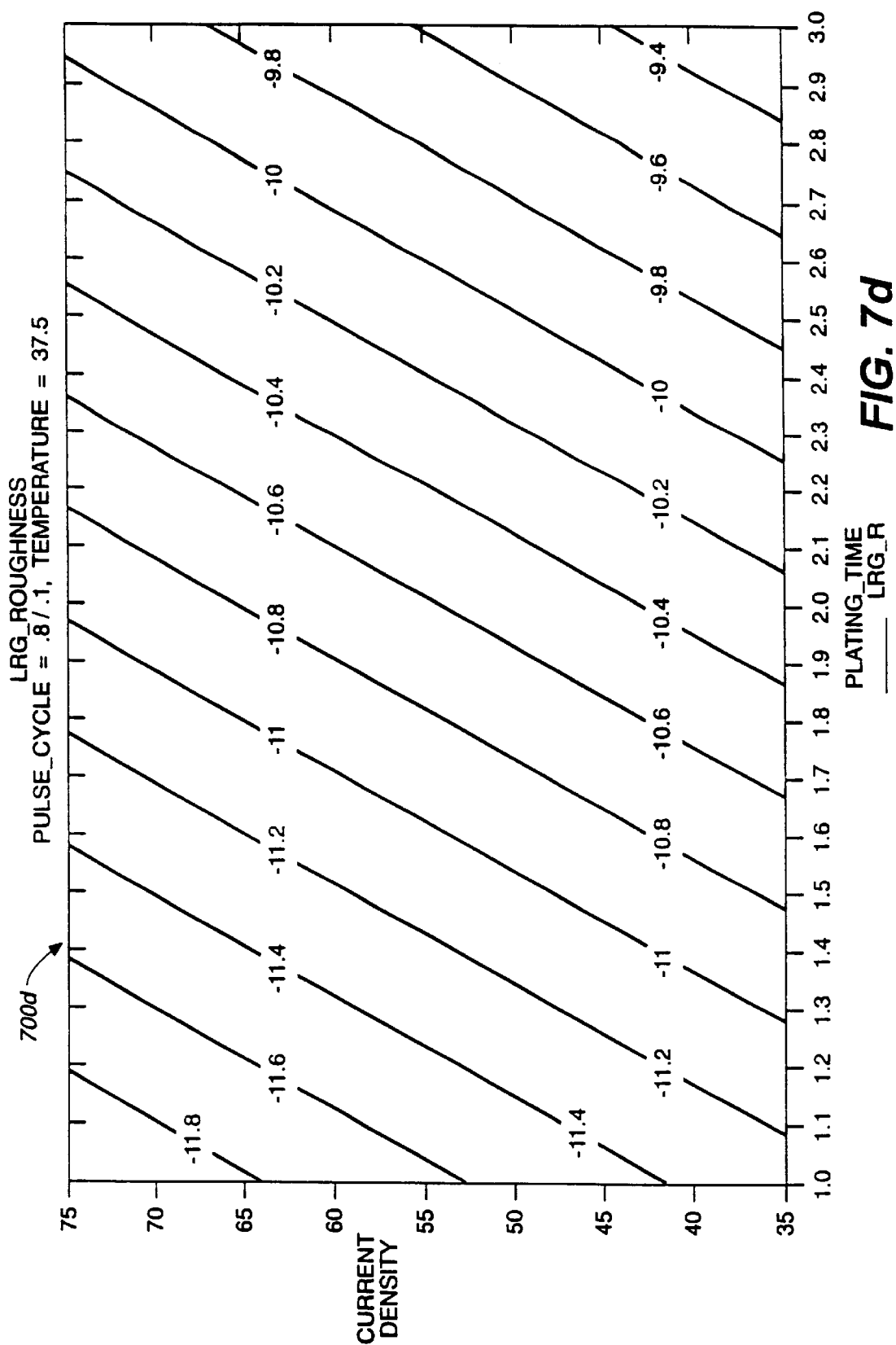
Figure 7E:
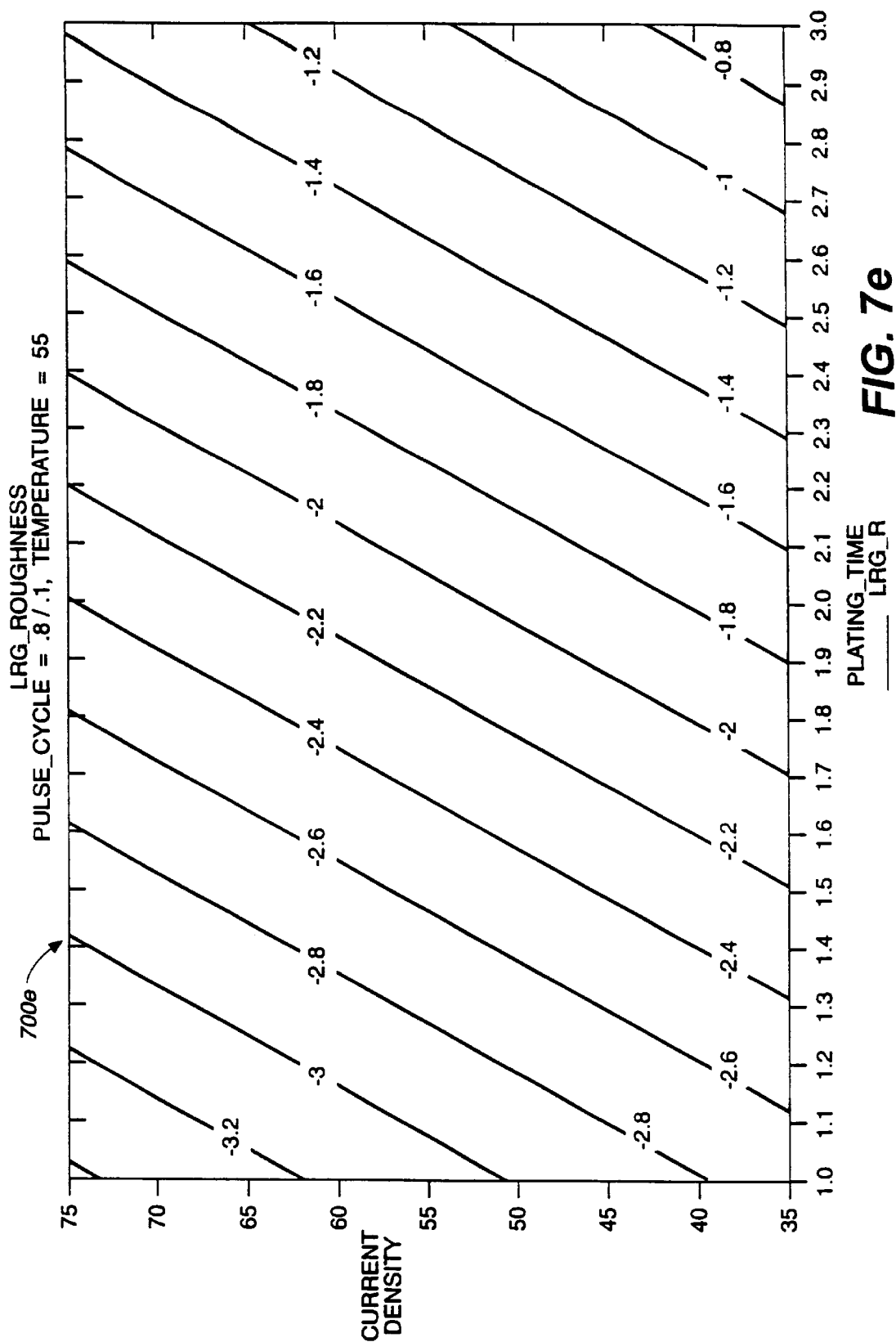
Figure 7F:
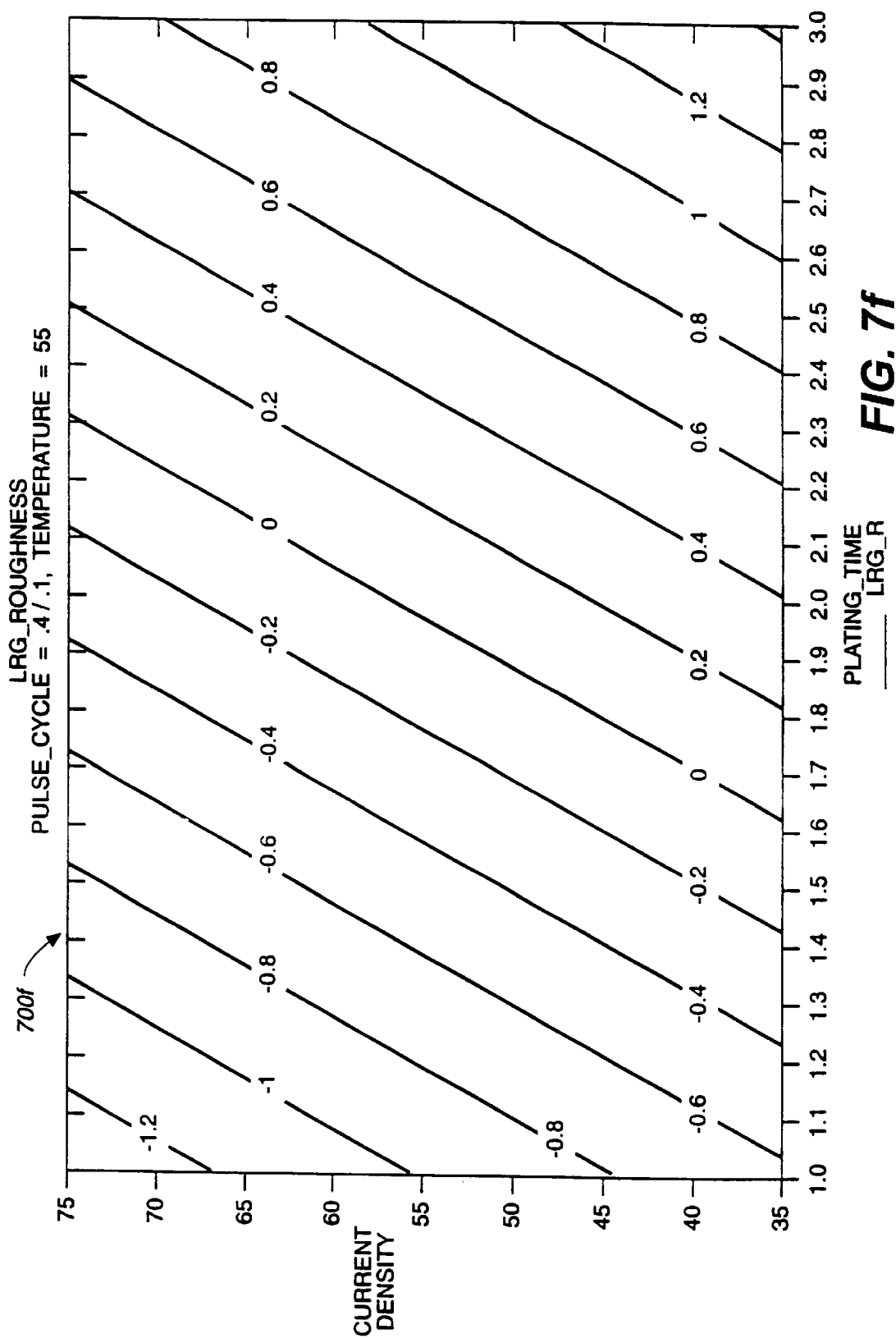

Referring to FIG. 5, each spike may be generally characterized by its height H, width W, and angle from normal θ. Measurements of spikes created by the described method had heights varying from about 0.353 microns to about 1.266 microns (mean: 0.718 microns), widths varying from about 0.345 microns to about 1.250 microns (mean: 0.715 microns), and an angle θ from about 10 degrees to about 45 degrees (mean: 28 degrees). Photomicrographs of a contact bump 26 having deposited spikes 28 are shown in FIGS. 6a (elevated) and 6b (enlarged). The spikes are relatively uniformly distributed across the surface of the contact with a density of 1 to 2 spikes/$\mu m^2$. In addition to the spikes, the surface of contact bump 26 exhibits rolling hills and valleys known as asperities, which do not affect the use of the electrical contact.

Each of the deposition parameters may be varied and still generate spikes on the substrate surface. Referring to FIGS. 7a through 7f, contour plots are shown for trading off different deposition parameters. The experimental results shown in contour plot 700a of FIG. 7a employed a duty cycle of 0.4 seconds ON, 0.1 seconds OFF, a deposition time of 2 minutes, and both current density I and temperature of electroplating solution were varied. Contour lines 710 represent an equivalent end result in terms of spike production, with higher numbers representing qualitatively better spikes (that is, −2 is better than −16). Contour plot 700b (FIG. 7b) performed the same trade-offs, but with a duty cycle of 0.6 seconds ON, 0.1 seconds OFF and a deposition time of 3 minutes. Contour plot 700c (FIG. 7c) performed the same trade-offs, but with a duty cycle of 0.8 seconds ON, 0.1 seconds OFF and a deposition time of 3 minutes.

Likewise, contour plots 700d through 700f varied both current density and plating time. Contour plot 700d used a duty cycle of 0.8 seconds ON, 0.1 seconds OFF and a temperature of 37.5 degrees C. Contour plot 700e used a duty cycle of 0.8 seconds ON, 0.1 seconds OFF and a temperature of 55 degrees C. Contour plot 700f used a duty cycle of 0.4 seconds ON, 0.1 seconds OFF and a temperature of 55 degrees C.

Again, contour lines 710 represent an equivalent end result in terms of spike production, with higher numbers representing qualitatively better spikes. For example, for a duty cycle of 0.8 seconds ON and 0.1 seconds off, better results are achieved with a temperature of 55 degrees compared with 37.5 degrees (compare FIG. 7d with FIG. 7e).

Figure 8A:
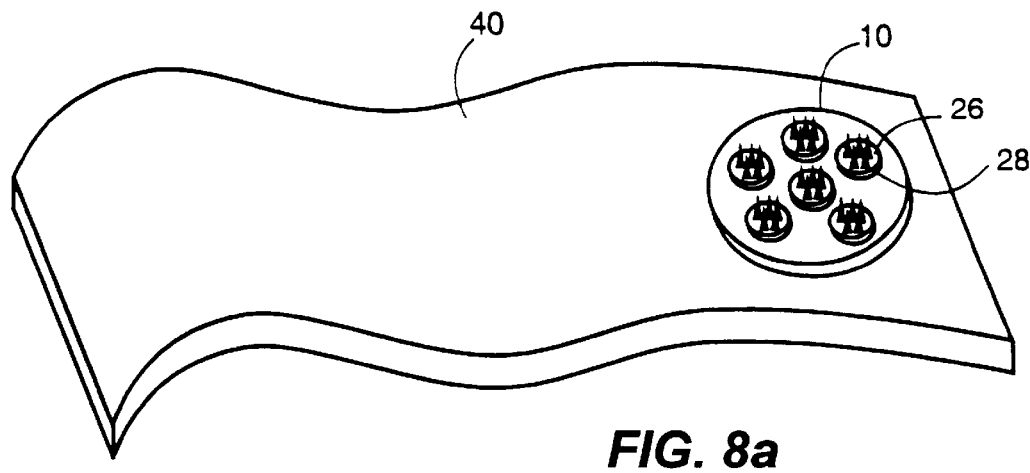
FIGS. 8a and 8b are elevated and cross-section views of a membrane having a contact pad with spikes.
Figure 8B:
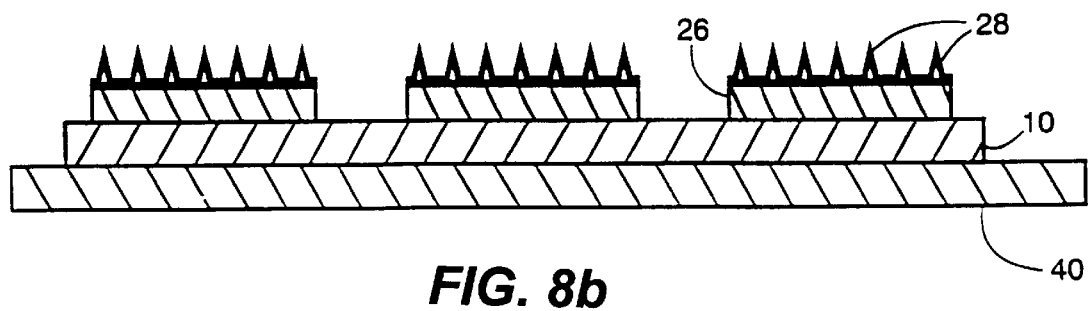

Referring to FIGS. 8a and 8b, a flexible membrane 40 (e.g., of polyimide film) has a contact pad 10. The surface of contact pad 10 has bumps 26 having spikes 28, for making excellent electrical contact with a corresponding device pad on a semiconductor device.

Other embodiments are within the scope of the claims. For example, different: metal solutions may be used for electroplating. Also, the spikes and other features may be formed on a variety of different substrates. Further, different time periods, current strengths, duty cycles, temperatures, and other deposition parameters may be employed.

What is claimed is:

1. A roughened contact comprising:
   a contact having a surface; and
   a solid metal layer deposited on the surface of the contact, the solid metal layer having spikes protruding away from the contact, the spikes being substantially conical, a side of each of the spikes having an angle from normal of between 10 degrees and about 45 degrees.

2. A roughened contact comprising:
   a contact having a surface; and
   a solid metal layer deposited on the surface of the contact, the solid metal layer having spikes protruding away from the contact, the spikes being substantially conical, each of the spikes having a base between about 0.345 microns and about 1.250 microns, a side of each of the spikes having an angle from normal of between 10 degrees and about 45 degrees.

3. A roughened contact comprising:

a contact having a surface; and a solid metal layer deposited on the surface of the contact, the solid metal layer having spikes protruding away from the contact, the spikes being substantially conical, a side of each of the spikes having an angle from normal of between 10 degrees and about 45 degrees.

4. A roughened contact comprising:

a contact having a surface; and a solid metal layer deposited on the surface of the contact, the solid metal layer having spikes protruding away from the contact, the spikes being substantially conical, a side of each of the spikes having an angle from normal of between 10 degrees, and about 45 degrees and the spikes having a density of between about 1 and about 2 spikes per square micrometer.

5. The contact of claim 1, 2, 3, or 4, wherein the solid metal layer comprises nickel.

6. The contact of claim 1, 2, 3, or 4 further comprising a conductive plating deposited on the surface of the solid metal layer.

7. The contact of claim 1, 2, 3, or 4, wherein the conductive plating comprises gold.

8. The contact of claim 1, 2, 3, or 4, wherein the spikes have a height between about 0.350 microns and about 1.275 microns.

9. A roughened contact comprising:

a contact having a surface;

a solid metal layer deposited on the surface of the contact, wherein the solid metal layer comprises nickel and has spikes protruding away from the contact, wherein the spikes are substantially conical, the spikes have a height between about 0.350 microns and about 1.275 microns, the spikes have a base between about 0.345 microns and about 1.250 microns, wherein a side of each of the spikes has an angle from normal of between about 10 degrees and about 45 degrees, and wherein the spikes have a density of between about 1 and about 2 spikes per square micrometer; and a conductive plating deposited on the surface of the solid metal surface, wherein the conductive plating comprises gold.

10. A membrane for use in testing a circuit comprising:

a flexible membrane substrate;

a contact on the flexible membrane substrate having a surface; and a solid metal layer deposited on the surface of the contact, the solid metal layer having spikes protruding away from the contact, the spikes being substantially conical, a side of each of the spikes having an angle from normal of between 10 degrees and about 45 degrees, and the spikes having a base between about 0.345 microns and about 1.250 microns.

11. A membrane for use in testing a circuit comprising:

a flexible membrane substrate;

a contact on the flexible membrane substrate having a surface; and a solid metal layer deposited on the surface of the contact, the solid metal layer having spikes protruding away from the contact, the spikes being substantially conical, and a side of each of the spikes having an angle from normal of between 10 degrees and about 45 degrees.

12. A membrane for use in testing a circuit comprising:

a flexible membrane substrate;

a contact on the flexible membrane substrate having a surface; and a solid metal layer deposited on the surface of the contact, the solid metal layer having spikes protruding away from the contact, the spikes being substantially conical, a side of each of the spikes having an angle from normal of between 10 degrees and about 45 degrees, and the spikes having a density of between about 1 and about 2 spikes per square micrometer.

13. The membrane of claim 10, 11, or 12, wherein the spikes are substantially conical.

14. The membrane of claim 10, 11, or 12, wherein the solid metal layer comprises nickel.

15. The membrane of claim 10, 11, or 12 further comprising a conductive plating deposited on the surface of the solid metal layer.

16. The membrane of claim 10, 11, or 12, wherein the conductive plating comprises gold.

17. The membrane of claim 10, 11, or 12, wherein the flexible membrane substrate comprises a polyimide film.

\* \* \* \* \*

UNITED STATES PATENT AND TRADEMARK OFFICE
CERTIFICATE OF CORRECTION

PATENT NO.    : 6,245,445 B1
DATED         : June 12, 2001
INVENTOR(S)   : James L. Lykins II It is certified that error appears in the above-identified patent and that said Letters Patent is hereby corrected as shown below:

Column 1,
Line 42, delete [ C.±about] and insert -- C ± about --

Column 3,
Line 32, delete [Centigrade±5] and insert -- Centigrade ± 5 --
Line 43, insert "s" after "second"

Column 4,
Line 51, delete [different:] and insert -- different --

Column 5,
Line 20, insert "," after "45 degress"

Signed and Sealed this

Twenty-sixth Day of February, 2002

Attest:

Attesting Officer

JAMES E. ROGAN
Director of the United States Patent and Trademark Office